United States Patent
Sakai et al.

(10) Patent No.: US 8,124,980 B2
(45) Date of Patent: Feb. 28, 2012

(54) DISPLAY DEVICE (75) Inventors: Takashi Sakai, Kokubunji (JP);
Katsumi Matsumoto, Mobara (JP)

(73) Assignee: Hitachi Displays, Ltd., Chiba (JP)

( * ) Notice: Subject to any disclaimer, the term of this patent is extended or adjusted under 35 U.S.C. 154(b) by 74 days.

(21) Appl. No.: 12/219,899

(22) Filed: Jul. 30, 2008

(65) Prior Publication Data
US 2009/0045408 A1 Feb. 19, 2009

(30) Foreign Application Priority Data

Aug. 15, 2007 (JP) .................. 2007-211791

(51) Int. Cl.
*H01L 33/00* (2010.01)
(52) U.S. Cl. .............. 257/72; 257/66; 257/E29.292
(58) Field of Classification Search .............. 257/66, 257/72, E29.292; 349/42–46
See application file for complete search history.

(56) References Cited

U.S. PATENT DOCUMENTS

4,896,149 A * 1/1990 Buzak et al. ............. 345/60
(Continued)

*Primary Examiner* — Tucker Wright
(74) *Attorney, Agent, or Firm* — Stites & Harbison, PLLC; Juan Carlos A. Marquez, Esq (57) ABSTRACT A display device includes a display panel which forms a plurality of sub pixels on a substrate thereof, and a drive circuit which is configured to drive the plurality of sub pixels, wherein the drive circuit has a thin film transistor formed on the substrate, and the thin film transistor has a semiconductor layer made of poly-silicon. The thin film transistor includes: a source electrode, a semiconductor layer and a drain electrode which are formed on the substrate; a gate insulation film which is formed on the source electrode, the semiconductor layer and the drain electrode; a gate electrode which is formed on the gate insulation film and above the semiconductor layer; an insulation film which is formed on the gate electrode; and a metal layer which is formed on the insulation film in a state that the metal layer covers at least a portion of the gate electrode.

9 Claims, 7 Drawing Sheets

U.S. PATENT DOCUMENTS 5,888,856 A 3/1999 Hamada

6,344,885 B1 * 2/2002 Mori et al. .................. 349/44

* cited by examiner

DISPLAY DEVICE

The present application claims priority from Japanese applications JP 2007-211791 filed on Aug. 15, 2007, the content of which is hereby incorporated by reference into this application.

BACKGROUND OF THE INVENTION

The present invention relates to a display device, and more particularly to a display device which includes thin film transistors (TFT) made of poly-silicon (poly-crystalline silicon).

As a kind of liquid crystal display device, conventionally, there has been known an active-matrix-type liquid crystal display device which includes an active element for every pixel, and operates the active element by switching.

As a kind of the active-matrix-type liquid crystal display device, there has been known a TFT-method active-matrix-type liquid crystal display module which uses a thin film transistor having a semiconductor layer made of poly-silicon (hereinafter, also referred to as a poly-silicon thin film transistor) as an active element.

In a liquid crystal display panel of the liquid crystal display module which uses the poly-silicon thin film transistor as the active element (hereinafter, referred to as a Poly-SiTr-TFT liquid crystal display module), the poly-silicon thin film transistors are arranged and formed on a quartz or a glass substrate in a matrix array. Further, an operation speed of the poly-silicon thin film transistor is higher than an operation speed of a thin film transistor having a semiconductor layer made of amorphous silicon. Accordingly, in the liquid crystal display panel of the Poly-SiTr-TFT liquid crystal display module, it is possible to form a peripheral circuit on the same substrate.

SUMMARY OF THE INVENTION

The above-mentioned poly-silicon thin film transistor is formed on the glass substrate using a low-temperature poly-silicon technique or the like.

However, with respect to the poly-silicon thin film transistor formed on the glass substrate which has low heat radiation property, during an ON-operation time of the transistor, due to a high gate voltage of 10V or more and a high drain voltage of 10V or more applied to the transistor, a drain current on the order of 500 μA or more flows in the transistor and hence, a temperature of the transistor is elevated to 100° C. or more. Accordingly, there has been a drawback that the characteristic of the poly-silicon thin film transistor is fluctuated attributed to such self-heating thus deteriorating the reliability of a product.

The present invention has been made to overcome the above-mentioned drawback of the related art, and it is an object of the present invention to provide a technique on a display device which can prevent the fluctuation of characteristic of a thin film transistor having a semiconductor layer made of poly-silicon formed on a substrate having low heat radiation property attributed to self-heating of the transistor.

The above-mentioned and other objects and novel features of the present invention will become apparent from the description of this specification and attached drawings.

To briefly explain typical invention among inventions disclosed in this application, they are as follows.

The present invention is directed to a display device including a display panel which forms a plurality of sub pixels on a substrate thereof, and a drive circuit which is configured to drive the plurality of sub pixels, the drive circuit having a thin film transistor formed on the substrate (for example, glass substrate with low heat radiation property), and the thin film transistor having a semiconductor layer made of poly-silicon, wherein the thin film transistor includes a source electrode, a semiconductor layer and a drain electrode which are formed on the substrate, a gate insulation film which is formed on the source electrode, the semiconductor layer and the drain electrode, a gate electrode which is formed on the gate insulation film and above the semiconductor layer, an insulation film which is formed on the gate electrode, and a metal layer which is formed on the insulation film in a state that the metal layer covers at least a portion of the gate electrode.

Due to such a constitution, in the present invention, by radiating heat which is generated when the thin film transistor is in an ON-operation state by way of the metal layer, it is possible to suppress the fluctuation of characteristic of the transistor.

To briefly explain advantageous effects obtained by the typical invention among inventions disclosed in this application, they are as follows.

According to a display device of the present invention, with respect to the thin film transistor which is formed on the substrate having low heat radiation property and has the semiconductor layer made of poly-silicon, it is possible to prevent the fluctuation of characteristic of the thin film transistor attributed to self-heating of the thin film transistor.

DETAILED DESCRIPTION OF PREFERRED EMBODIMENTS

Hereinafter, an embodiment of the present invention is explained in detail in conjunction with drawings.

Here, in all drawings for explaining the embodiment, parts having identical functions are given same numerals and their repeated explanation is omitted.

Figure 1:
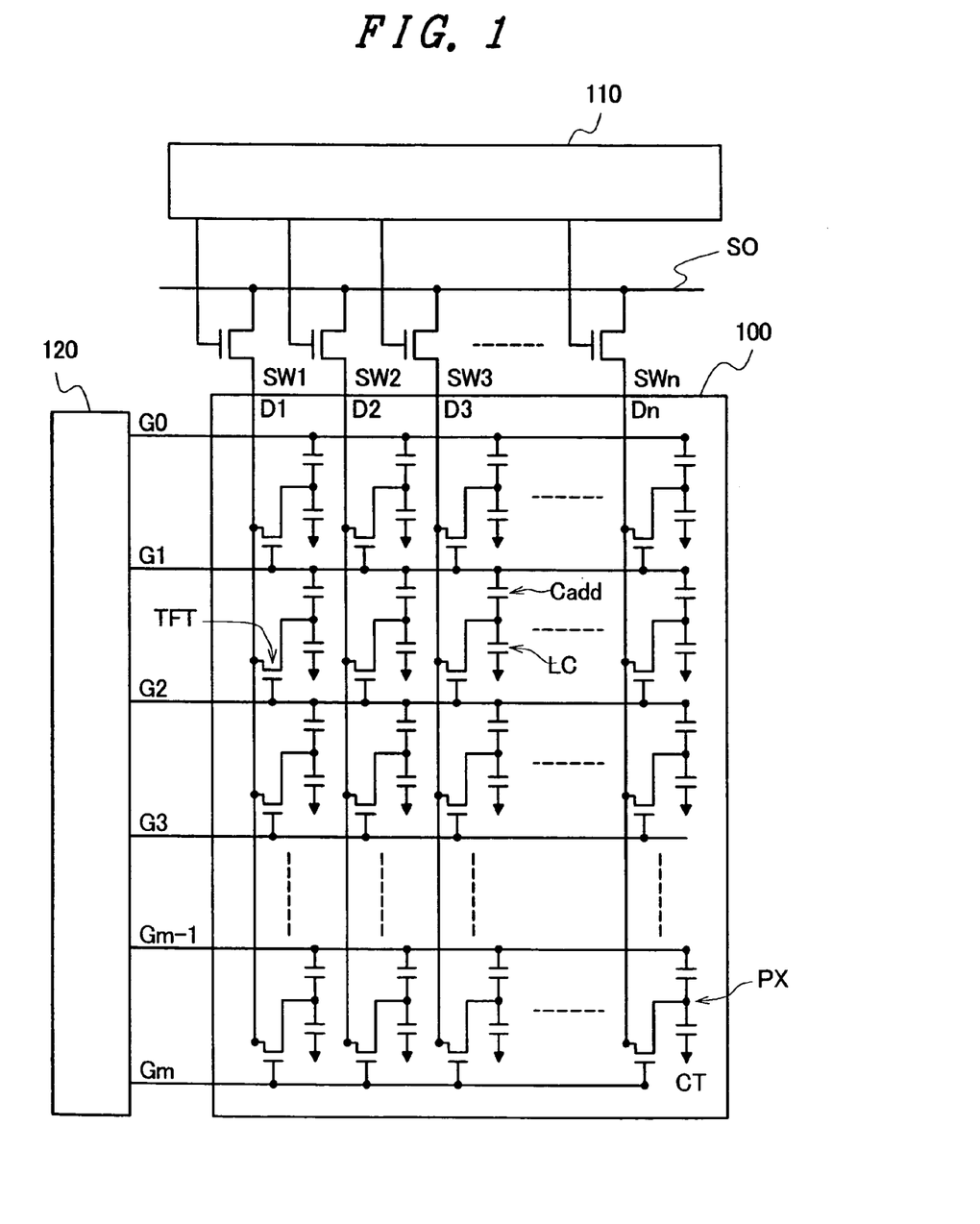
FIG. 1 is a view showing an equivalent circuit of a liquid crystal display panel of a liquid crystal display module of an embodiment according to the present invention.

FIG. 1 is a view showing an equivalent circuit of a liquid crystal display panel of a liquid crystal display module of the embodiment according to the present invention.

In FIG. 1, numeral 100 indicates a display part, numeral 110 indicates a horizontal shift register circuit (also referred to as a video line shift register circuit), and numeral 120 indicates a vertical shift register circuit (also referred to as a scanning line shift register circuit).

The display part 100 includes sub pixels arranged in a matrix array, and each sub pixel is arranged in an intersecting region (a region surrounded by four signal lines) between two neighboring scanning lines (gate signal lines or horizontal signal lines) (G0 to Gm) and two neighboring video lines (drain signal lines or vertical signal lines) (D1 to Dn).

Each sub pixel includes a pixel transistor (TFT), and the pixel transistor (TFT) is formed of a thin film transistor having a semiconductor layer made of poly-silicon. Drain electrodes of the pixel transistors (TFT) in each column of the respective sub pixels arranged in a matrix array are connected with each video line (D1 to Dn) and, further, a source electrode of each pixel transistor (TFT) is connected with sub pixel electrode (PX).

Here, naming of the drain electrode and the source electrode is determined based on a bias polarity between these electrodes originally, and in the liquid crystal display module of this embodiment, the bias polarity is reversed during operation and hence, the drain electrode and the source electrode are interchangeable with each other during operation. However, in this specification, for the sake of brevity, the explanation is made by assuming one electrode as the drain electrode and another electrode as the source electrode. Further, with respect to the gate electrodes of the pixel transistors (TFT) for each row of the respective sub pixels arranged in a matrix array, the gate electrodes of the pixel transistors (TFT) for every row are respectively connected with the scanning lines (G0 to Gm), and the scanning lines (G0 to Gm) are connected with the horizontal shift register circuit 110. The respective pixel transistors (TFT) are turned on when a positive bias voltage is applied to the gate electrodes, and is turned off when a negative bias voltage is applied to the gate electrodes. Further, a liquid crystal layer is arranged between the pixel electrode (PX) and the counter electrode (CT) and hence, liquid crystal capacitance (LC) is equivalently connected with the respective pixel electrodes (PX), and holding capacitance (Cadd) is connected between the scanning line (G0 to Gm) in a preceding stage and the pixel electrode (PX).

The horizontal shift register circuit 110 and the vertical shift register circuit 120 shown in FIG. 1 are circuits arranged in the inside of the liquid crystal display panel (hereinafter, referred to as peripheral circuits). These peripheral circuits are respectively constituted of a thin film transistor using a semiconductor layer made of poly-silicon (hereinafter, referred to as poly-silicon thin film transistor) in the same manner as the pixel transistor (TFT) which constitutes the active element of each sub pixel. These poly-silicon thin film transistors are formed simultaneously with the pixel transistors (TFT) constituting the active elements of the respective sub pixels.

In this embodiment, a scanning-line selection signal is sequentially outputted to the respective scanning lines (G0 to Gm) from the vertical shift register circuit 120 for every 1 H period (scanning period). Accordingly, the pixel transistors (TFT) which have the gate electrodes thereof connected with the scanning line (G0 to Gm) are turned on during 1 H period.

Further, in this embodiment, switching transistors (SW1 to SWn) are formed for the respective video lines (D1 to Dn). The switching transistors (SW1 to SWn) are sequentially turned on in response to a shift output of H level outputted from the horizontal shift register circuit 110 during 1H period (scanning period) so as to connect the video lines (D1 to Dn) and a video signal line (SO) with each other.

Hereinafter, the manner of operation of the liquid crystal display panel of this embodiment is briefly explained.

The horizontal shift register circuit 110 shown in FIG. 1 sequentially selects the scanning lines (G0 to Gm) in response to a start pulse and a vertical driving clock signal and outputs a positive bias voltage to the selected scanning line (G0 to Gm).

Accordingly, the pixel transistors (TFT) having the gate electrodes thereof connected with the selected scanning line (G0 to Gm) are turned on.

Further, the horizontal shift register circuit 110 sequentially turns on the switching transistors (SW1 to SWn) during 1H period (scanning period) in response to the start pulse and the horizontal driving clock signal and connects the video lines (D1 to Dn) and the video signal lines (SO) with each other.

Accordingly, the video signals (voltages of the video signals) on the video signal lines (SO) are outputted to the video lines (D1 to Dn), fetched video signals (voltages of the video signals) are written in the sub pixels whose pixel transistors (TFT) having the gate electrodes thereof connected with the selected scanning lines (G0 to Gm) are turned on so that an image is displayed on the liquid crystal display panel.

Figure 2:
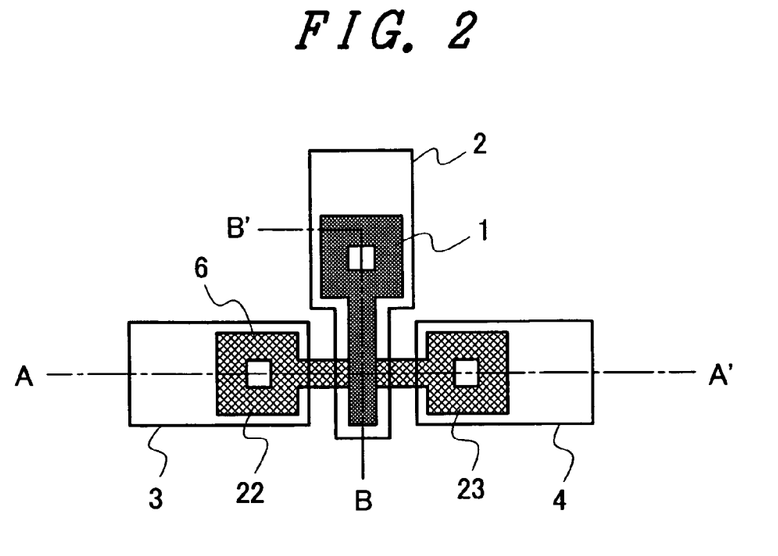
FIG. 2 is a plan view showing the electrode structure of a poly-silicon thin film transistor which uses a semiconductor layer made of poly-silicon in a peripheral circuit of the embodiment according to the present invention.
Figure 3:
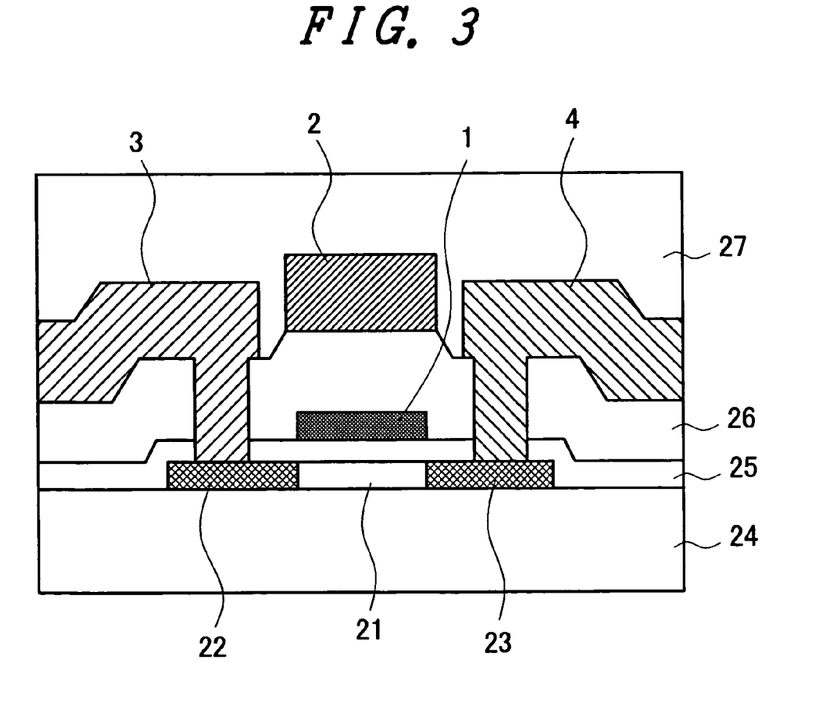
FIG. 3 is a cross-sectional view showing the cross-sectional structure taken along a line A-A' in FIG. 2.

FIG. 2 is a plan view showing the electrode structure of the poly-silicon thin film transistor which is arranged in the peripheral circuit of this embodiment and uses the semiconductor layer made of poly-silicon, and FIG. 3 is a cross-sectional view showing the cross-sectional structure taken along a line A-A' in FIG. 2.

As shown in FIG. 2 and FIG. 3, the poly-silicon thin film transistor in the peripheral circuit of this embodiment is constituted of a source electrode 22, a semiconductor layer 21 and a drain electrode 23 which are formed on a substrate (for example, a glass substrate) 24, a gate insulation film 25 which is formed on the source electrode 22, the semiconductor layer 21 and the drain electrode 23, a gate electrode 1 which is formed on the gate insulation film 25 and above the semiconductor layer 21, an interlayer insulation film 26 which is formed on the gate electrode 1, a source line layer 3, a gate line layer 2 and a drain line layer 4 which are formed on the interlayer insulation film 26, and a protective film 27 which covers the gate line layer 2, the drain line layer 4 and the source line layer 3.

Here, the source line layer 3 is connected with the source electrode 22 via a contact hole 6 formed in the gate insulation film 25 and the interlayer insulation film 26, and the drain line layer 4 is connected with the drain electrode 23 via a contact hole 6 formed in the gate insulation film 25 and the interlayer insulation film 26. Further, the gate line layer 2 is connected with the gate electrode 1 via a contact hole 6 formed in the interlayer insulation film 26. Further, the source line layer 3, the gate line layer 2 and the drain line layer 4 are formed of a metal layer (for example, aluminum layer, molybdenum layer or a tungsten layer).

The poly-silicon thin film transistor shown in FIG. 2 and FIG. 3 is characterized in that the gate electrode 1 which is formed on the semiconductor layer 21 is covered with the gate line layer 2 which is made of metal such as, for example, aluminum, molybdenum or tungsten exhibiting high heat conductivity by way of the interlayer insulation film 26.

Due to such a constitution, heat which is generated during operation by the poly-silicon thin film transistor into which an electric current on the order of 500 µA or more flows during operation can be radiated by way of the gate line layer 2 and hence, it is possible to prevent the fluctuation of characteristic of the poly-silicon thin film transistor attributed to the self-heating of the poly-silicon thin film transistor.

That is, although the self-heating of operation of the poly-silicon thin film transistor may become a cause of the fluctuation of the transistor characteristic such as a threshold value voltage (Vth), due to the above-mentioned structure of this embodiment, it is possible to prevent the fluctuation of transistor characteristic. Accordingly, the circuit operation lifetime can be prolonged thus enhancing the reliability of a product.

Figure 4:
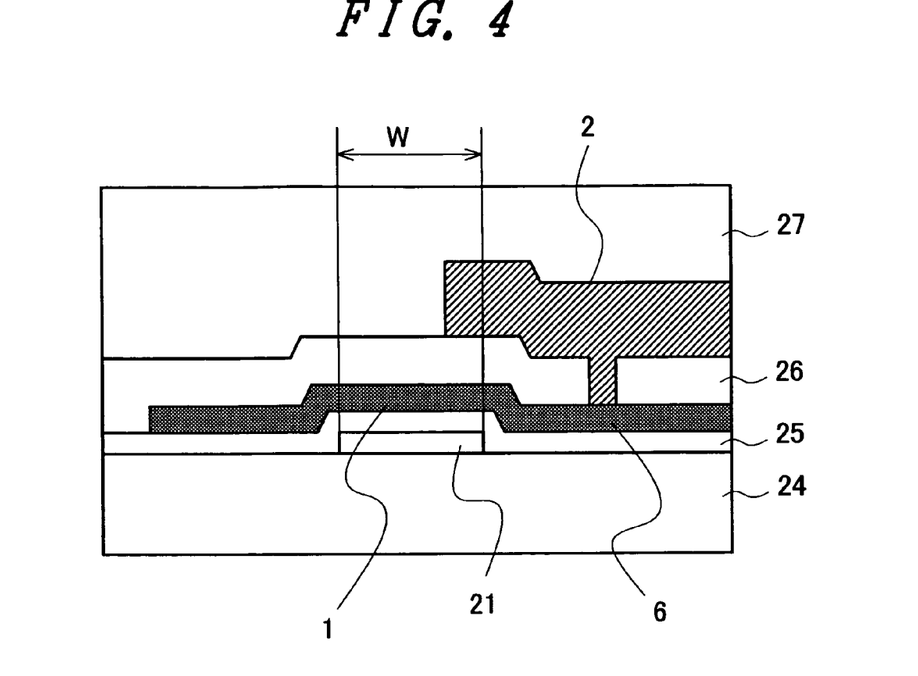
FIG. 4 is a cross-sectional view showing another example of the cross-sectional structure taken along a line A-A' in FIG. 2.

Here, not only the structure in which the gate line layer 2 covers the whole gate electrode 1 but also the structure in which the gate line layer 2 covers a portion of the gate electrode 1 can acquire the above-mentioned advantageous effect. Accordingly, provided that an end portion of the gate line layer 2 is arranged within the gate electrode as shown in FIG. 4, that is, provided that the end portion of the gate line layer 2 is arranged within the gate width (w) as viewed in the direction orthogonal to the substrate 24, it is possible to acquire the above-mentioned advantageous effect. Here, FIG. 4 corresponds to a cross-sectional structure taken along a line B-B' in FIG. 2.

Figure 5:
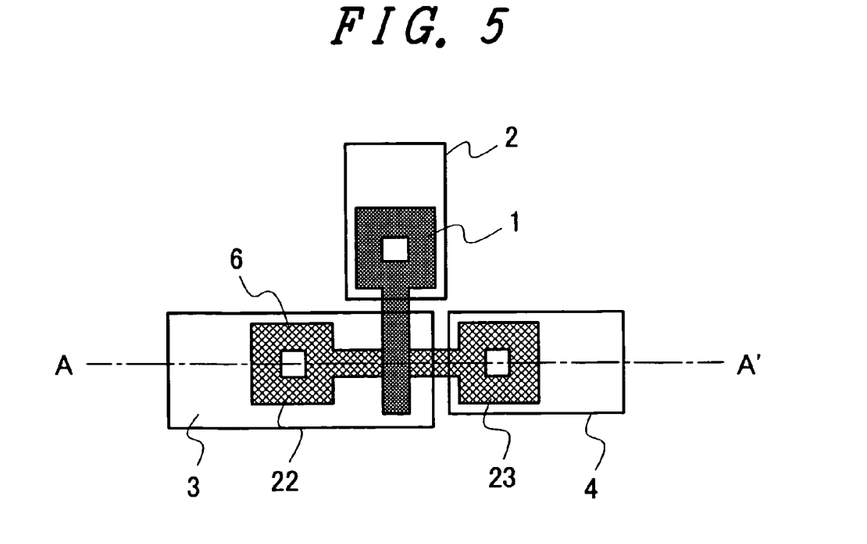
FIG. 5 is a plan view showing another example of the electrode structure of a poly-silicon thin film transistor which uses a semiconductor layer made of poly-silicon in a peripheral circuit of the embodiment according to the present invention.
Figure 6:
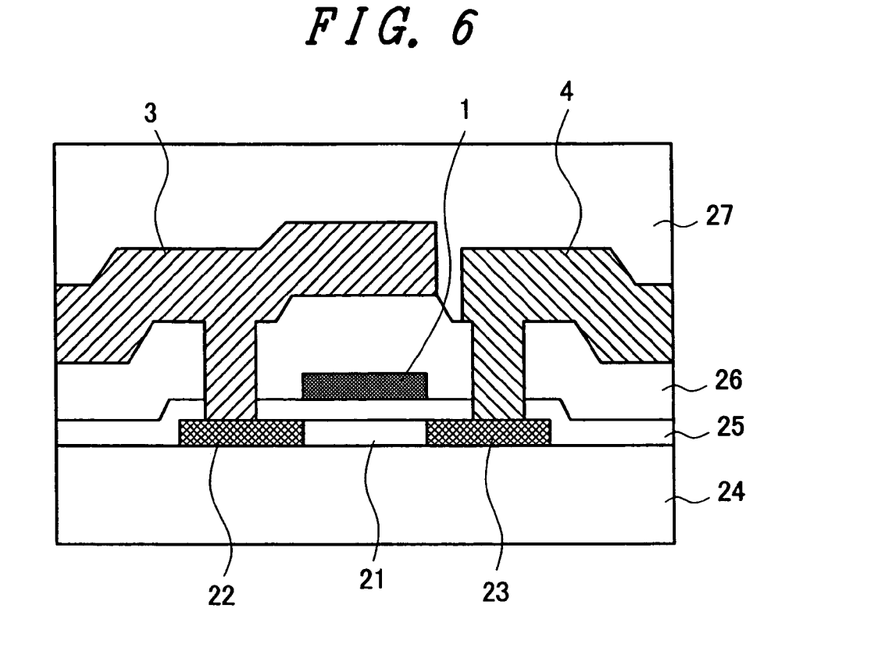
FIG. 6 is a cross-sectional view showing the cross-sectional structure taken along a line A-A' in FIG. 5.

FIG. 5 is a plan view showing another example of the electrode structure of the poly-silicon thin film transistor which uses a semiconductor layer made of poly-silicon in a peripheral circuit of this embodiment, and FIG. 6 is a cross-sectional view showing the cross-sectional structure taken along a line A-A' in FIG. 5.

The poly-silicon thin film transistor shown in FIG. 5 and FIG. 6 is characterized in that the gate electrode 1 which is formed on the semiconductor layer 21 is covered with the source line layer 3 which is made of metal such as, for example, aluminum, molybdenum or tungsten exhibiting high heat conductivity by way of the interlayer insulation film 26.

Figure 7:
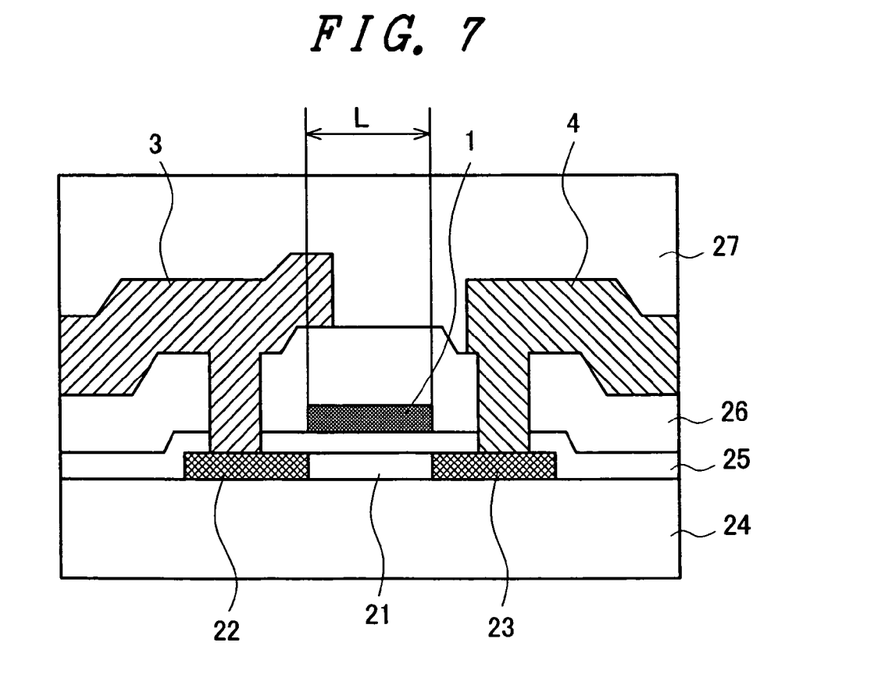
FIG. 7 is a cross-sectional view showing another example of the cross-sectional structure taken along a line A-A' in FIG. 5.

The structure shown in FIG. 5 and FIG. 6 can also acquire the above-mentioned advantageous effect. Here, not only the structure in which the source line layer 3 covers the whole gate electrode 1 but also the structure in which the source line layer 3 covers a portion of the gate electrode 1 can acquire the above-mentioned advantageous effect. Accordingly, provided that an end portion of the source line layer 3 is arranged within the gate electrode as shown in FIG. 7, that is, provided that the end portion of the source line layer 3 is arranged within a gate length (L) as viewed in the direction orthogonal to the substrate 24, it is possible to acquire the above-mentioned advantageous effect.

Figure 8:
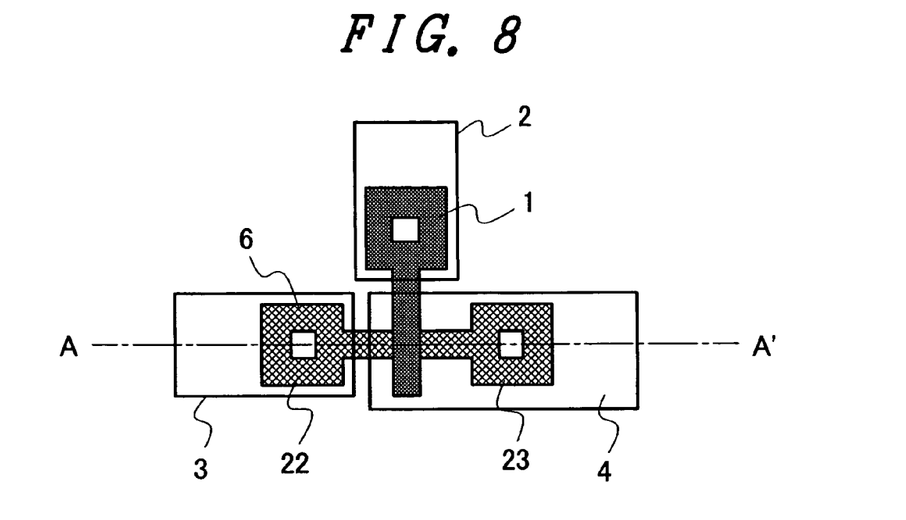
FIG. 8 is a plan view showing another example of the electrode structure of a poly-silicon thin film transistor which uses a semiconductor layer made of poly-silicon in a peripheral circuit of the embodiment according to the present invention.
Figure 9:
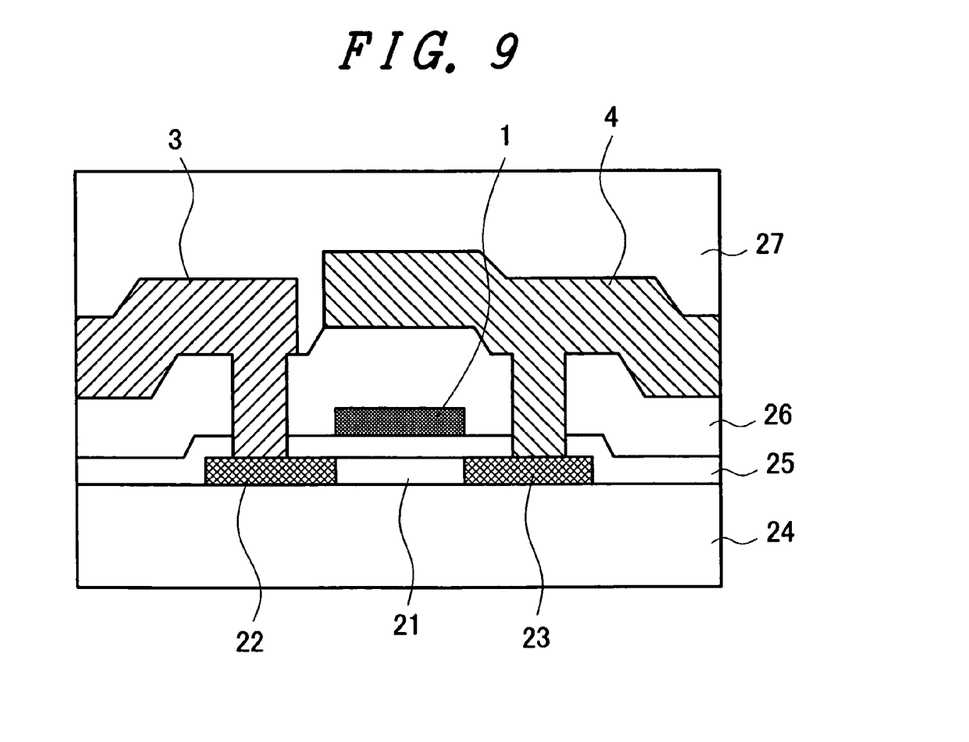
FIG. 9 is a cross-sectional view showing the cross-sectional structure taken along a line A-A' in FIG. 8.

FIG. 8 is a plan view showing another example of the electrode structure of the poly-silicon thin film transistor which uses a semiconductor layer made of poly-silicon in the peripheral circuit of this embodiment, and FIG. 9 is a cross-sectional view showing the cross-sectional structure taken along a line A-A' in FIG. 8.

The poly-silicon thin film transistor shown in FIG. 8 and FIG. 9 is characterized in that the gate electrode 1 which is formed on the semiconductor layer 21 is covered with the drain line layer 4 which is made of metal such as, for example, aluminum, molybdenum or tungsten exhibiting high heat conductivity by way of the interlayer insulation film 26.

The structure shown in FIG. 8 and FIG. 9 can also acquire the above-mentioned advantageous effect. Here, not only the structure in which the drain line layer 4 covers the whole gate electrode 1 but also the structure in which the drain line layer 4 covers a portion of the gate electrode 1 can acquire the above-mentioned advantageous effect. Accordingly, provided that an end portion of the drain line layer 4 is arranged within the gate electrode, that is, provided that the end portion of the drain line layer 4 is arranged within the gate length (L) shown in FIG. 7 as viewed in the direction orthogonal to the substrate 24, it is possible to acquire the above-mentioned advantageous effect.

Figure 10:
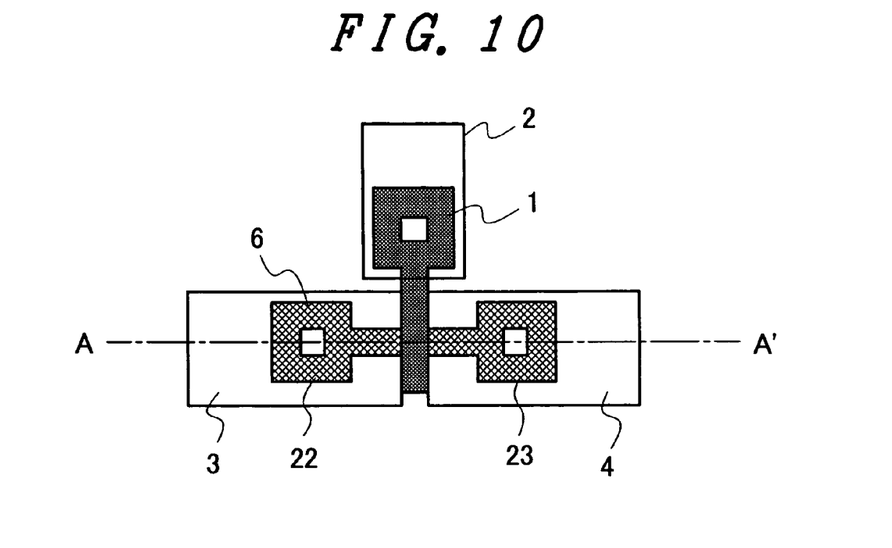
FIG. 10 is a plan view showing another example of the electrode structure of a poly-silicon thin film transistor which uses a semiconductor layer made of poly-silicon in a peripheral circuit of the embodiment according to the present invention.
Figure 11:
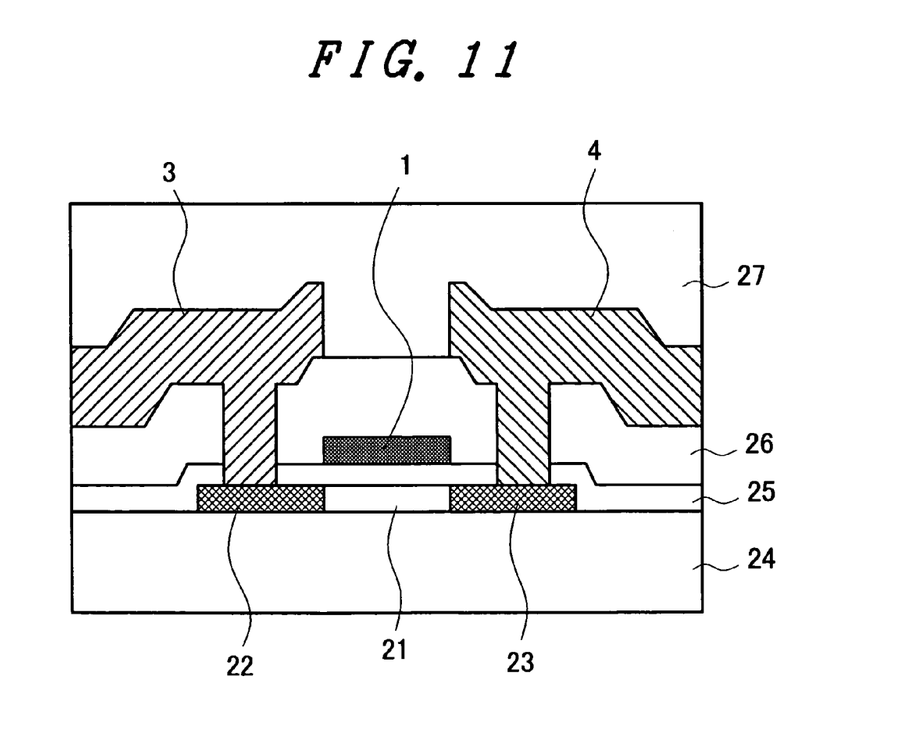
FIG. 11 is a cross-sectional view showing the cross-sectional structure taken along a line A-A' in FIG. 10.

FIG. 10 is a plan view showing another example of the electrode structure of the poly-silicon thin film transistor which uses a semiconductor layer made of poly-silicon in the peripheral circuit of this embodiment, and FIG. 11 is a cross-sectional view showing the cross-sectional structure taken along a line A-A' in FIG. 10.

The poly-silicon thin film transistor shown in FIG. 10 and FIG. 11 is characterized in that the gate electrode 1 which is formed on the semiconductor layer 21 is covered with the source line layer 3 and the drain line layer 4 which are made of metal such as, for example, aluminum, molybdenum or tungsten exhibiting high heat conductivity by way of the interlayer insulation film 26. In this case, the source line layer 3 and the drain line layer 4 are arranged on the gate electrode with a predetermined distance therebetween.

The structure shown in FIG. 10 and FIG. 11 can also acquire the above-mentioned advantageous effect. Here, provided that an end portion of the source line layer 3 and an end portion of the drain line layer 4 are arranged within the gate length (L) shown in FIG. 7 as viewed in the direction orthogonal to the substrate 24, it is possible to acquire the above-mentioned advantageous effect.

Figure 12:
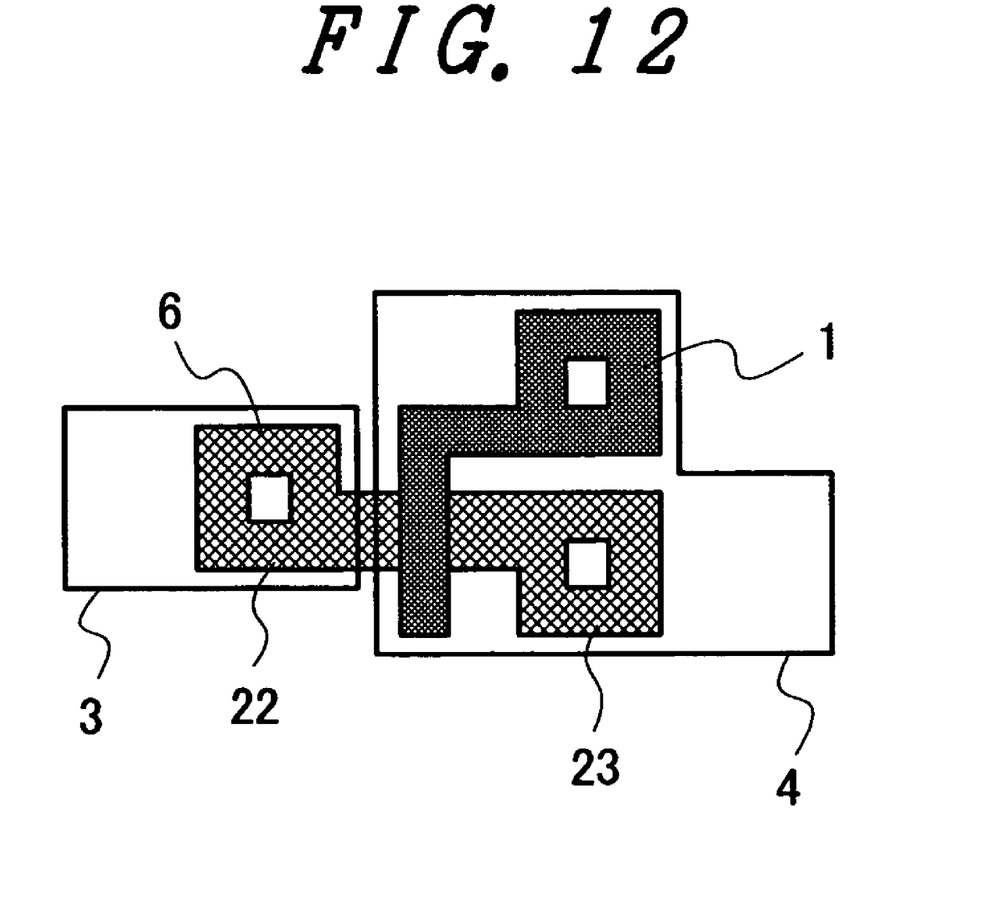
FIG. 12 is a plan view showing another example of the electrode structure of a poly-silicon thin film transistor which uses a semiconductor layer made of poly-silicon in a peripheral circuit of the embodiment according to the present invention.

FIG. 12 is a plan view showing another example of the electrode structure of the poly-silicon thin film transistor which uses a semiconductor layer made of poly-silicon in the peripheral circuit of this embodiment.

The poly-silicon thin film transistor shown in FIG. 12 is a poly-silicon thin film transistor which adopts the diode connection for allowing the source electrode or the drain electrode to have the same potential as the gate electrode, and is characterized in that the gate electrode 1 formed on the semiconductor layer 21 is covered with the drain line layer 4 which is made of metal such as, for example, aluminum, molybdenum or tungsten exhibiting high heat conductivity by way of the interlayer insulation film 26.

The structure shown in FIG. 12 can also acquire the above-mentioned advantageous effect. Here, provided that an end portion of the drain line layer 4 is arranged within the gate width (w) shown in FIG. 4 or the gate length (L) shown in FIG. 7 as viewed in the direction orthogonal to the substrate 24, it is possible to acquire the above-mentioned advantageous effect.

As has been explained heretofore, according to this embodiment, the gate electrode of the poly-silicon thin film transistor which is formed on the substrate (for example, the glass substrate having low heat radiation property) is covered with the metal layer exhibiting high heat conductivity (for example, the gate line layer, the source line layer or the drain line layer) by way of the insulation film and hence, the heat generated when the poly-silicon thin film transistor is in an ON operation state can be radiated by way of the metal layer whereby it is possible to suppress the fluctuation of characteristic of the thin film transistor. Accordingly, the circuit operation lifetime can be prolonged thus enhancing the reliability of the product.

Here, the above-mentioned structure of this embodiment can be particularly effectively applicable to the poly-silicon thin film transistor which generates heat by itself when an electric current of 500 µA or more flows therein during a normal circuit operation.

Further, the substrate 24 is not limited to the glass substrate. That is, even when a substrate having the substantially same thermal expansion coefficient as the glass substrate is used as the substrate 24, by applying the above-mentioned structure of this embodiment to such a substrate, it is possible to prevent the fluctuation of characteristic attributed to the self-heating of the poly-silicon thin film transistor.

Further, although the above-mentioned explanation has been made with respect to the embodiment in which the present invention is applied to the liquid crystal display device, it is needless to say that the present invention is not limited to the above-mentioned embodiment and is also applicable to an EL display device which uses an organic EL element or the like, for example.

Although the invention made by the inventors of the present invention have been specifically explained in conjunction with the embodiment heretofore, it is needless to say that the present invention is not limited to the above-mentioned embodiment and various modifications are conceivable without departing from the gist of the present invention.

What is claimed is:

1. A display device, comprising:
    a display panel having a plurality of sub pixels on a substrate thereof; and
    a drive circuit which is configured to drive the plurality of sub pixels, the drive circuit having a thin film transistor formed on the substrate, and the thin film transistor having a semiconductor layer made of poly-silicon, wherein
    the thin film transistor includes:
    a source electrode, a semiconductor layer and a drain electrode which are formed on the substrate;
    a gate insulation film which is formed on the source electrode, the semiconductor layer and the drain electrode;
    a gate electrode which is formed on the gate insulation film and above the semiconductor layer;
    an insulation film which is formed on the gate electrode; and
    a gate line layer which is formed on the gate insulation film wherein
    the insulation film is formed on an entire region where the gate electrode and the semiconductor layer overlap each other,
    the gate line layer covers at least a portion of the entire region via the insulation film,
    the gate line layer is connected with the gate electrode via a contact hole, and the contact hole is formed in a region which is different from the entire region,
    wherein the gate line layer is an aluminum layer.

2. A display device according to claim 1, wherein an end portion of the gate line layer overlaps the entire region as viewed in a direction orthogonal to the substrate.

3. A display device according to claim 1, wherein the thin film transistor is a thin film transistor through which an electric current of 500 µA or more flows during an operation time of the thin film transistor.

4. A display device according to claim 1, wherein the substrate is a glass substrate.

5. A display device, comprising:
    a display panel having a plurality of sub pixels on a substrate thereof; and
    a drive circuit which is configured to drive the plurality of sub pixels, the drive circuit having a plurality of thin film transistors formed on the substrate, and the thin film transistors having a semiconductor layer made of poly-silicon, wherein
    the thin film transistors include:
    a source electrode, a semiconductor layer and a drain electrode which are formed on the substrate;
    a gate insulation film which is formed on the source electrode, the semiconductor layer and the drain electrode;
    a gate electrode which is formed on the gate insulation film and above the semiconductor layer;
    an insulation film which is formed on the gate electrode; and
    a gate line layer which is formed on the gate insulation film, wherein
    the insulation film is formed on an entire region where the gate electrode and the semiconductor layer overlap each other,
    the gate line layer covers at least a portion of the entire region via the insulation film,
    the gate line layer is connected with the gate electrode via a contact hole,
    the contact hole is formed in a region which is different from the entire region,
    the gate line layer is formed above an upper side of the gate electrode via the insulation film, and
    the upper side is opposite to a lower side of the gate electrode, the lower side facing the semiconductor layer.

6. A display device according to claim 5, wherein the gate line layer is an aluminum layer.

7. A display device according to claim 5, wherein an end portion of the gate line layer overlaps the entire region as viewed in a direction orthogonal to the substrate.

8. A display device according to claim 5, wherein the thin film transistor is a thin film transistor through which an electric current of 500 µA or more flows during an operation time of the thin film transistor.

9. A display device according to claim 5, wherein the substrate is a glass substrate.

* * * * *

UNITED STATES PATENT AND TRADEMARK OFFICE
CERTIFICATE OF CORRECTION

| | | |
|---|---|---|
| PATENT NO. | : 8,124,980 B2 | Page 1 of 1 |
| APPLICATION NO. | : 12/219899 | |
| DATED | : February 28, 2012 | |
| INVENTOR(S) | : Sakai et al. | |

It is certified that error appears in the above-identified patent and that said Letters Patent is hereby corrected as shown below:

On the Title Page:
Under Item (73) Assignee: add as the second assignee

"Panasonic Liquid Crystal Display Co., Ltd., Hyogo-Ken, Japan"

Signed and Sealed this
Seventeenth Day of July, 2012

David J. Kappos
*Director of the United States Patent and Trademark Office*